(12) United States Patent
Yang

(10) Patent No.: US 11,130,673 B2
(45) Date of Patent: Sep. 28, 2021

(54) PACKAGING METHOD AND PACKAGING STRUCTURE

(71) Applicant: Ningbo Semiconductor International Corporation, Ningbo (CN)

(72) Inventor: Tianlun Yang, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 24 days.

(21) Appl. No.: 16/702,800

(22) Filed: Dec. 4, 2019

(65) Prior Publication Data

US 2020/0198964 A1 Jun. 25, 2020

Related U.S. Application Data

(63) Continuation of application No. PCT/CN2019/078541, filed on Mar. 18, 2019.

(30) Foreign Application Priority Data

Dec. 25, 2018 (CN) .......................... 201811595035.9

(51) Int. Cl.
*B81C 1/00* (2006.01)
*B81B 7/02* (2006.01)

(52) U.S. Cl.
CPC .............. *B81C 1/0023* (2013.01); *B81B 7/02* (2013.01); *B81C 1/00269* (2013.01); *B81C 2203/0118* (2013.01)

(58) Field of Classification Search
CPC ...... B81C 1/0023; B81C 1/00269; B81B 7/02
See application file for complete search history.

(56) References Cited

U.S. PATENT DOCUMENTS

| 2009/0108381 | A1 | 4/2009 | Buchwalter et al. |
| 2014/0264744 | A1* | 9/2014 | Chu .................... H01L 41/1138 257/532 |

FOREIGN PATENT DOCUMENTS

| CN | 104045051 A | 9/2014 |
| CN | 105645349 A | 6/2016 |
| CN | 106575673 A | 4/2017 |

\* cited by examiner

*Primary Examiner* — Thomas L Dickey
(74) *Attorney, Agent, or Firm* — Anova Law Group, PLLC

(57) ABSTRACT

A packaging method and a packaging structure are provided. The packaging method includes providing a cap wafer including a groove; forming a sacrificial layer in the groove and a first device on the sacrificial layer; providing a substrate wafer and a second device formed on the substrate wafer; bonding a surface of the cap wafer having the first device formed thereon with a surface of the substrate wafer having the second device formed thereon, to form an electrical connection between the first device and the second device; and removing the sacrificial layer from a side of the cap wafer away from the substrate wafer, to form a cavity. The first device is located in the cavity.

20 Claims, 7 Drawing Sheets

PACKAGING METHOD AND PACKAGING STRUCTURE

CROSS-REFERENCES TO RELATED APPLICATION

This application is a continuation application of PCT Patent Application No. PCT/CN2019/078541, filed on Mar. 18, 2019, which claims priority to Chinese patent applications No. 201811595035.9, filed on Dec. 25, 2018, the entirety of all of which is incorporated herein by reference.

FIELD OF THE DISCLOSURE

The present disclosure generally relates to the field of packaging technologies and more particularly, relates to a packaging method and a packaging structure.

BACKGROUND

Micro-Electro-Mechanical System (MEMS) devices have advantages of miniaturization, integration, high performance, and low cost. MEMS devices have been widely used in fields including automobile, aerospace, satellite navigation, signal processing, and biology. Most MEMS devices need to work in a vacuum environment or an inert gas airtight environment. A vacuum packaging cost for a shell and tube level packaging process is high and cannot meet requirements on low-cost MEMS devices. As the MEMS devices develop, a wafer-level packaging (WLP) process has been developed gradually to reduce a packaging cost of the MEMS devices.

As illustrated in FIG. 1, a wafer-level packaging method for a MEMS device includes: in a vacuum environment, aligning and bonding a second surface of a to-be-packaged wafer including a completed MEMS device 102 to a complementary-metal-oxide-semiconductor (CMOS) wafer 100 with a CMOS device 100*a*; in the vacuum environment, aligning and bonding a cap wafer 104 including a groove 103 to a first surface of the to-be-packaged wafer 101, to form a packaging cavity of the MEMS device 102 through the groove 103 and complete a wafer-level vacuum packaging on the MEMS device 102; and forming a separate packaged MEMS product by dicing. The CMOS wafer 100 is used to provide different types of circuits for the MEMS device 102, and the cap wafer 104 is used as a vacuum cap for the MEMS device 102.

However, such packaging method for the MEMS device has the following defects:

1. the packaging method needs three wafers to finish, and has a high cost and is not good for producing ultra-thin products;
2. all structures of the MEMS device need to be formed in the middle wafer. When the MEMS device is complex, a fabrication process is difficult and is not good for improving the integration level of the product;
3. a portion or an entire MEMS device needs to be formed by a high-temperature process or other special processes, which cannot be integrated with the CMOS circuit structure in a same platform. When the packaging is formed by three wafers, utilization efficiency of the wafers is low.

Therefore, there is a need to provide a packaging method and a packaging structure to reduce a number of wafers used in the packaging process, improve the utilization efficiency of the wafers, and reduce the cost.

SUMMARY

One aspect of the present disclosure provides a packaging method. The method includes: providing a cap wafer including a groove; forming a sacrificial layer in the groove and a first device on the sacrificial layer; providing a substrate wafer including a second device formed on the substrate wafer; bonding a surface of the cap wafer having the first device formed thereon with a surface of the substrate wafer having the second device formed thereon, to form an electrical connection between the first device and the second device; and removing the sacrificial layer from a side of the cap wafer away from the substrate wafer, to form a cavity. The first device is located in the cavity.

Another aspect of the present disclosure provides a packaging structure. The packaging structure includes: a cap wafer including a groove, a sacrificial layer in the groove, and a first device on the sacrificial layer; and a substrate wafer including a second device on the substrate wafer. The sacrificial layer can be removed. A surface of the cap wafer having the first device formed thereon is bonded with a surface of the substrate wafer having the second device formed thereon, to form an electrical connection between the first device and the second device. After removing the sacrificial layer, a cavity is formed between the cap wafer and the substrate wafer. The first device is located in the cavity.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Figure 1:
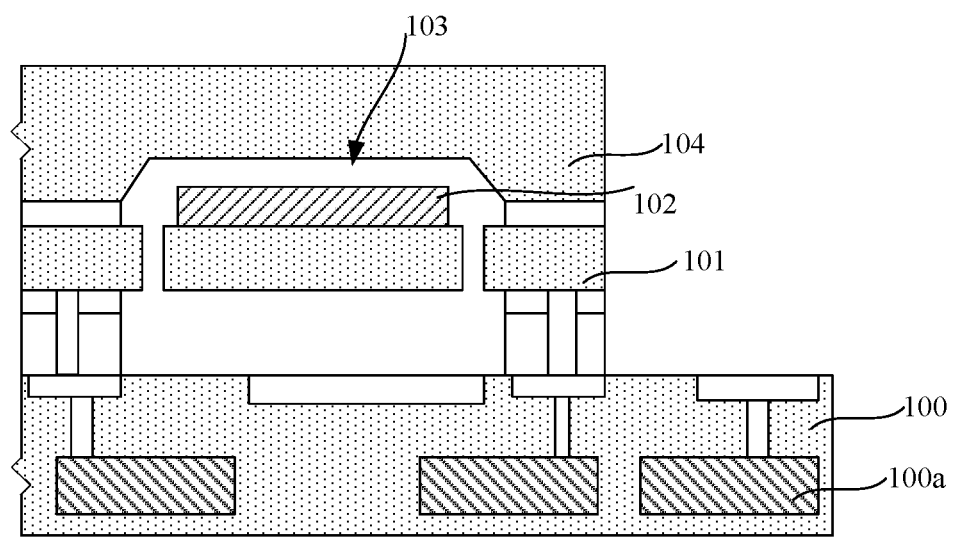
FIG. 1 illustrates a cross-section view of a MEMS device being packaged by a wafer-level vacuum packaging method.

Reference will now be made in detail to exemplary embodiments of the disclosure, which are illustrated in the accompanying drawings. Hereinafter, embodiments consistent with the disclosure will be described with reference to drawings. In the drawings, the shape and size may be exaggerated, distorted, or simplified for clarity. Wherever possible, the same reference numbers will be used throughout the drawings to refer to the same or like parts, and a detailed description thereof may be omitted. Further, in the present disclosure, the disclosed embodiments and the features of the disclosed embodiments may be combined under conditions without conflicts. It is apparent that the described embodiments are some but not all of the embodiments of the present disclosure. Based on the disclosed embodiments, persons of ordinary skill in the art may derive other embodiments consistent with the present disclosure, all of which are within the scope of the present disclosure. Moreover, the present disclosure is described with reference to schematic diagrams. For the convenience of descriptions of the embodiments, the cross-sectional views illustrating the device structures may not follow the common proportion and may be partially exaggerated. Besides, those schematic diagrams are merely examples, and not intended to limit the scope of the disclosure. Furthermore, a three-dimensional (3D) size including length, width and depth should be considered during practical fabrication.

Figure 2:
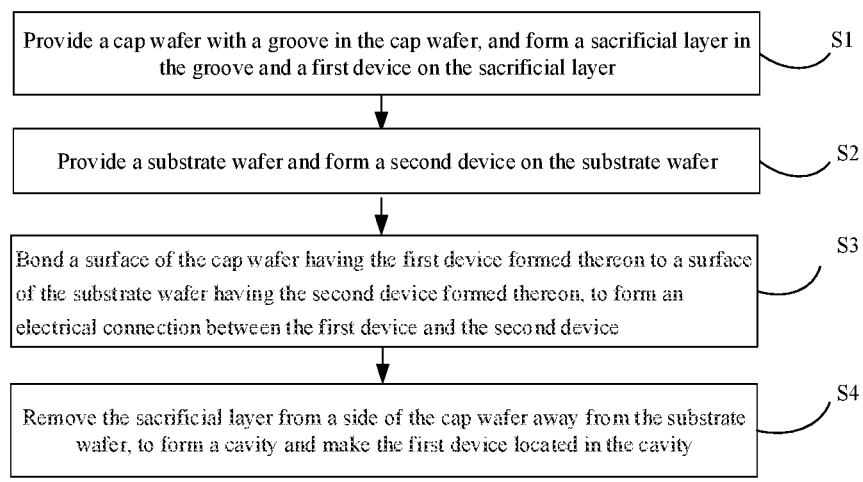
FIG. 2 illustrates an exemplary packaging method consistent with various disclosed embodiments of the present disclosure.

The present disclosure may provide a packaging method. As illustrated in FIG. 2, the packaging method may include:

S1: providing a cap wafer including a groove, forming a sacrificial layer in the groove, and forming a first device on the sacrificial layer;

S2: providing a substrate wafer including a second device on the substrate wafer;

S3: bonding a surface of the cap wafer with the first device to a surface of the substrate wafer with the second device, where the first device may be electrically connected to the second device; and S4: removing the sacrificial layer from a side of the cap wafer away from the substrate wafer to form a cavity between the cap wafer and the substrate wafer, where the first device may be in the cavity.

FIG. 3A to FIG. 3I illustrate device structures corresponding to certain stages of an exemplary packaging method in FIG. 2 consistent with various disclosed embodiments of the present disclosure.

Figure 3A:
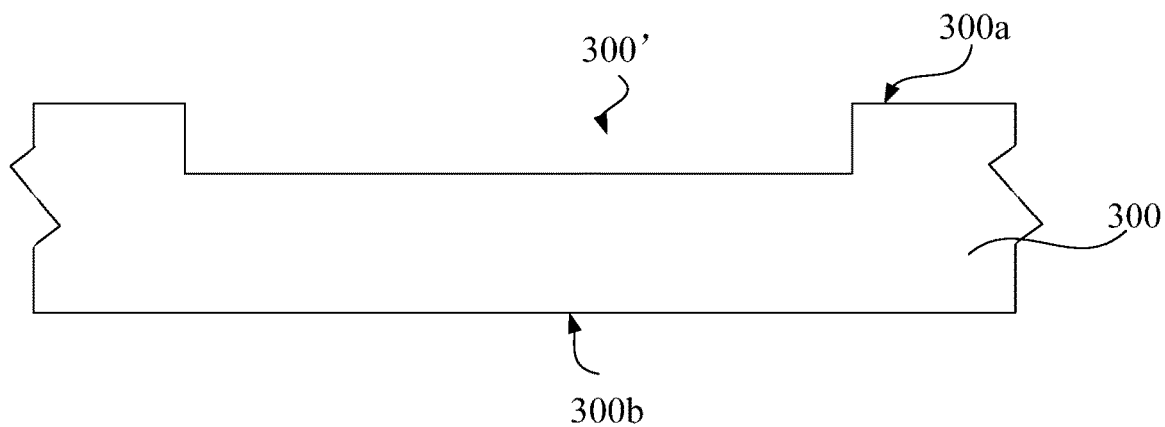
FIG. 3A to FIG. 3I illustrate device structures corresponding to certain stages of an exemplary packaging method consistent with various disclosed embodiments of the present disclosure.

As illustrated in FIG. 3A, in S1, a cap wafer 30 with a first surface 300a (that is a front surface) and a second surface 300b (that is a back surface) may be provided. The cap wafer 30 may include a first substrate 300. The first substrate may be any suitable substrate including a semiconductor substrate, a glass substrate, a quartz substrate, a transparent polymer substrate, a sapphire substrate, or a ceramic substrate. The semiconductor substrate may be made of a material including Si, Ge, SiGe, SiC, SiGeC, InAs, GaAs, InP, InGaAs, another III-V compound semiconductor, or a combination thereof. The semiconductor substrate may also be a multilayer structure formed by semiconductor materials, a silicon-on-insulator (SOI) substrate, a stacked-silicon-on-insulator (SSOI) substrate, a stacked-SiGe-on-insulator (S—SiGeOI) substrate, a SiGe-on-insulator (SiGeOI) substrate, or a germanium-on-insulator (GeOI) substrate. The first substrate 300 may be a bare wafer. Then an oxide layer (not shown in the figures) may be formed on the first surface 300a of the first substrate 300 by a thermal oxidation process, to be used as a protective layer for protecting the first surface 300a of the cap wafer 30.

Then, as illustrated in FIG. 3A, in S1, a patterned photoresist layer (not shown in the figures) may be formed by a photolithography process including photoresist coating, exposure, and development, to define a groove on the first surface 300a of the first substrate 300. And then the first surface 300a of the first substrate 300 may be etched to a predetermined depth by using the patterned photoresist layer as a mask, to form the groove 300'. A vertical cross-section of the groove 300' (a cross-section parallel to the first surface 300a of the cap wafer 30) may be a quadrangle, a hexagon, a circle, or an ellipse. A longitudinal cross-section of the groove 300' (a cross-section perpendicular to the first surface 300a of the cap wafer 30) may be a rectangle, a positive trapezoid, an inversed trapezoid, or a U shape. A depth of the groove 300' may be determined by a depth of the cavity needed for forming the first device subsequently, to meet the packaging requirement for the first device. The depth of the groove 300' may be about 5 μm to 20 μm, such as 8 μm, 10 μm, 12 μm, or 15 μm. Subsequently, the patterned photoresist layer may be removed. For description purposes only, the embodiment where the groove is formed by above process is used as an example to illustrate the present disclosure, and should not limit the scopes of the present disclosure. In various embodiments, other suitable processes (such as a laser grooving process, a blade cutting process) may be used to form the groove in the cap wafer.

For description purposes only, the above embodiment where the first substrate 300 is provided as a bare wafer in S1 is used as an example to illustrate the present disclosure and should not limit the scopes of the present disclosure. In various embodiments, the first substrate 300 may be substrate material after suitable treatments including ion implantation, deposition, and etching, or may include any suitable devices or metal interconnection structures in another area of the first substrate 300 outside an area for forming the groove, as long as the structures do not affect the formation of the groove and a subsequent release hole. The devices may include active devices including memories, logic circuits, power devices, bipolar devices, independent MOS transistors, or a combination thereof. The devices may also include optoelectrical devices including light-emitting diodes. The devices may also include passive devices including resistors, capacitors, or a combination thereof.

Figure 3B:
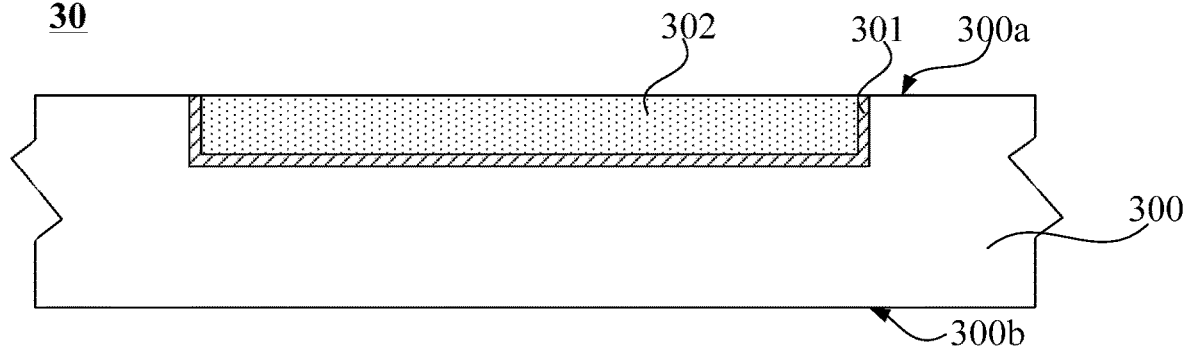

In S1, as illustrated in FIGS. 3A-3B, after forming the groove 300', a sacrificial layer 302 may be formed by a vapor deposition process or a spinning coating process, to fill the groove 300'. The sacrificial layer 302 may be made of at least one of polyimide (PI), amorphous carbon (α-C), silicon oxide (OX), phosphorus-doped silica glass (PSG), and boron-doped silica glass (BPSG). The sacrificial layer 302 may also be made of at least one of semiconductor materials different from a material of the cap wafer 30. For example, the first substrate 300 may be made of single crystalline silicon, and semiconductor materials different from a material of the first substrate 300 may include germanium, amorphous silicon, polycrystalline silicon.

A large etching selection ratio between the sacrificial layer 302 and the first substrate 300 may facilitate a release of the sacrificial layer 302, and releasing the sacrificial layer 302 may damage the first substrate 300. In one embodiment, before filling the groove 300' with the sacrificial layer 302, a protective layer 301 may be formed to cover a bottom wall and sidewalls of the groove 300' by a thermal oxidization process or a chemical vapor deposition process (such as a plasma-enhanced chemical vapor deposition process, PECVD). The protective layer 301 may extend from a region of the groove 300' to a portion or the entire first surface 300a of the first substrate 300. The protective layer 301 may protect the first substrate from damage when releasing the sacrificial layer 302. The protective layer 301 may be made of a material including silicon oxide, silicon nitride, silicon oxynitride, anti-reflective film, and adsorbent. The protective layer 301 may also be made of a metal material including Mo, and Al, or a metal nitride material including TiN and MoAlN. The protective layer 302 may have a thickness of about 3 nm to about 500 nm.

For description purposes only, the above embodiment where the groove 300' and the sacrificial layer 302 are formed by the etching and filling process is used as an example to illustrate the present disclosure and should not limit the scopes of the present disclosure. In various embodiments, the groove 300' and the sacrificial layer 302 can be formed by any suitable process. For example, in another embodiment, the material of the first substrate 300 in a region defined by the groove 300' may be modified by an ion implantation process, to transform the material of the first substrate 300 in the region defined by the groove 300' into the sacrificial layer 302. The process for transforming the material of the first substrate 300 in the region defined by the groove 300' into the sacrificial layer 302 may include: implanting doping ions into a preset region (the region defined by the groove 300') of the first surface 300a of the first substrate 300; forming a doped region by an annealing process; and transforming the doped region in the first surface 300a of the first substrate 300 into the sacrificial layer 302 and the groove 300' accommodating the sacrificial layer 302. The doping ions may be ions with a conductive type opposite to a conductive type of the ions in the first substrate 300, and may have a concentration larger than a concentration of doping ions in the first substrate 300. The annealing temperature may be about 900° C. to about 1100° C., and an optimized temperature may be about 1000° C. The annealing time may be about 40 minutes to about 60 minutes. The formed sacrificial layer 302 may be made of a porous material.

Figure 3C:
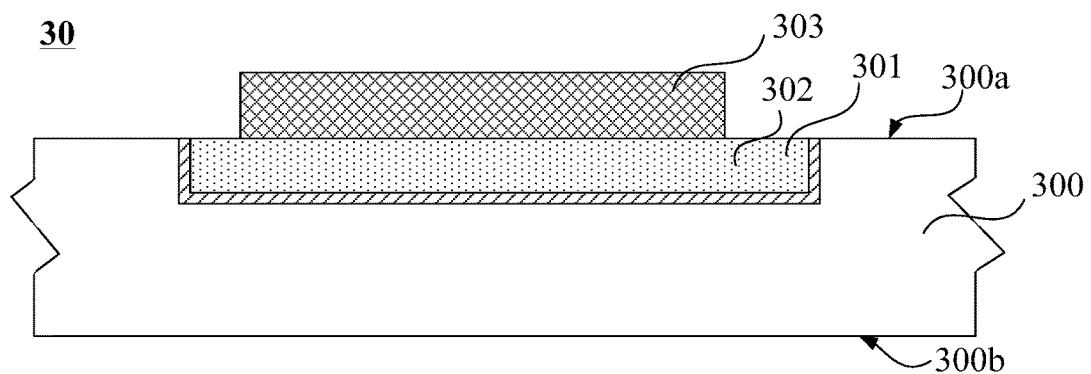

As illustrated in FIG. 3C, in S2, a first device 303 may be formed on the sacrificial layer 302 by a corresponding semiconductor fabrication process according to a layout design. The first device 303 may be disposed on the sacrificial layer 302 and may not cover other regions outside the sacrificial layer 302. Correspondingly, the first device 303 may be completely separated from the cap wafer 30 after subsequent removing the sacrificial layer 302.

The first device may be a portion or an entire independent device with an independent function, and CMOS circuits supporting operation of the first device 303 may be formed on the substrate wafer subsequently. An incompatibility between the first device 303 requiring high temperature or other special processes and a portion of the CMOS circuits, which induces that the first device 303 and the CMOS circuits cannot be integrated into a same platform, may be avoided.

The first device 303 may be formed on a surface of the sacrificial layer 302 by a corresponding semiconductor fabrication process. The independent device corresponding to the first device 302 may be an active device including memories, logic circuits, power devices, bipolar devices, MEMS, or a combination thereof. The independent devices may also include optoelectrical devices including light-emitting diodes. The independent devices may also include inactive devices including resistors, capacitors, or a combination thereof. The MEMS may include at least one of a gyroscope, an accelerometer, an inertial sensor, a pressure sensor, a flow sensor, a displacement sensor, an electric field sensor, an electric field strength sensor, a current sensor, a magnetic flux sensor, a magnetic field strength sensor, a temperature sensor, a heat flow sensor, a thermal conductivity sensor, a light modulator, an acoustic sensor, a gas sensor, a humidity sensor, an ion sensor, a biosensor. The independent device corresponding to the first device 302 may be a chip including only one component, or a chip including a plurality of components with a same structure, or a chip with a plurality of components with different structures and/or different function.

In the present disclosure, the first surface 300a of the cap wafer 30 may be a surface of the cap wafer 30 where the sacrificial layer 302 and the first device 303 are formed, and the second surface 300b may be another surface of the cap wafer 30 opposite to the first surface 300a. The first surface 300a of the cap wafer 30 may be referred to as a front surface, and the second surface 300b may be referred to as a back surface.

Figure 3D:
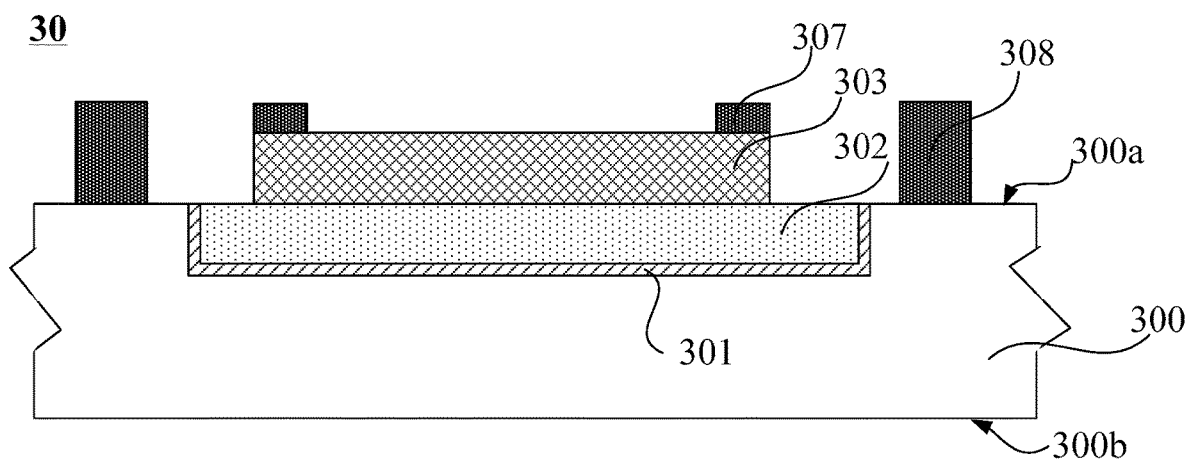

As illustrated in FIG. 3D, in S3, a first bonding structure 307 on the first device 303 and a first seal ring 308 on the first surface 300a of the cap wafer 30 at a periphery of the groove 300' may be formed by a lift-off process, a lithography/etching process.

The first bonding structure 307 may have a conductive pillar structure such as a metal conductive pillar structure, and may be made of a metal conductive material including Al, Ge, Cu, Au, Ni, Sn, Pt, Ag, W, or a combination thereof. The first seal ring 308 may be used to seal the cavity, and may be made of an insulating material used widely for bonding and sealing in the industry, such as a die attach film (DAF), a dry film, or a metal material. In one embodiment, the first bonding structure 307 may be flush with a top surface of the first seal ring 308 (that is, a surface of the first seal ring 308 away from the first surface 300a of the cap wafer 30), to make a second bonding structure (403 in FIG. 3E) on the substrate wafer flush with a top surface of a second seal ring (404 in FIG. 3E). Difficulty in fabricating the second bonding structure and the second seal ring may be reduced, the difficulty of a subsequent bonding process may also be reduced, and a structural stability after bonding may be improved. In various embodiments, the first seal ring 308 and the first bonding structure 307 may be formed simultaneously or at different times. In one embodiment, the first seal ring 308 and the first bonding structure 307 may be formed simultaneously, and may be made of a same material, such as a metal material. Since the first seal ring 308 may be disposed at the periphery of the groove 300', a portion of the surface of the cap wafer 30 where the first seal ring 308 is formed and a portion of the surface of the substrate wafer where the second seal ring is formed may be covered by an insulating material, the portion of the surface of the cap wafer 30 where the first seal ring 308 is formed and the portion of the surface of the substrate wafer where the second seal ring is located may be not electrically connected after bonding the first seal ring 308 with the subsequent second seal ring. In some other embodiments, the first seal ring 308 and the first bonding structure 307 may be formed at different times, and then may be made of different materials. For example, the first bonding structure 307 may be made of a metal material, and the first seal ring 308 may be made of an insulating material including DAF and/or dry film.

In one embodiment, the lift-off process may include: coating the first surface 300a of the cap wafer 30 where the first device 303 is formed with photoresist; patterning the photoresist on the first surface 300a of the cap wafer 30 by a lithography process, to expose a portion of the first surface 300a of the cap wafer 30 in a specific area and the surface of the first device 303; forming a metal film; then removing the photoresist using a solvent. In the area covered by the photoresist, the metal film may be formed on the photoresist. In the area not covered by the photoresist, the metal film may be formed on the first surface 300a of the cap wafer 30 and on the surface of the first device 303 not covered by the photoresist. When removing the photoresist, a portion of the metal film which is unnecessary (a portion of the metal film formed on the photoresist) may be detached in the solvent when the photoresist is dissolved, and another portion of the metal film formed directly on the first surface 300a of the cap wafer 30 and on the surface of the first device 303 may be preserved to form a pattern of the first bonding structure 307. In some embodiments, the first seal ring 308 may be formed with a same material as the first bonding structure 307 when forming the first bonding structure 307 by the lift-off process. A combination pattern of the first seal ring 308 and the first bonding structure 307 may be achieved and a process may be simplified.

In some embodiments, the lithography/etching process may include: forming a metal film on the first surface 300a of the cap wafer 30 where the first device 303 is formed by a physical vapor deposition process; covering the metal film with a photoresist and patterning the photoresist by a lithography process including exposure and development, to expose a portion of the metal film in a specific area; and etching the metal film by using the photoresist as a mask. When using a positive photoresist, a portion of the metal film covered by the positive photoresist may be preserved. When using a negative photoresist, a portion of the metal film exposed by the negative photoresist may be preserved. Another portion of the metal film may be removed correspondingly. A pattern corresponding to the first bonding structure 307 may be achieved. In some embodiments, the first seal ring 308 may be formed with a same material as the first bonding structure 307 when forming the first bonding structure 307 by the above process. A combination pattern of the first seal ring 308 and the first bonding structure 307 may be achieved and a process may be simplified.

In some other embodiments, the lithography/etching process may include: forming an interlayer dielectric layer on the first surface 300a of the cap wafer 30 where the first device 303 is formed; coating the interlayer dielectric layer with a photoresist and patterning the photoresist by a lithography process including exposure and development, to expose a portion of the interlayer dielectric layer in a specific area; and etching the interlayer dielectric layer by using the photoresist as a mask, to form an opening pattern required by the first bonding structure 307 and the first sealing ring; and filling the opening pattern with a metal by a metal filling process including an electrical plating process. If a surface of the interlayer dielectric layer is covered with the metal with a certain thickness when filling the opening pattern with the metal, the abundant metal may be removed by a process including a chemical mechanical polishing process and then the interlayer dielectric layer may be removed according to actual needs, to get a pattern corresponding to the first bonding structure 307 with a flushed surface. In some embodiments, the first seal ring 308 may be formed with a same material when forming the first bonding structure 307 by the above process. A combination pattern of the first seal ring 308 and the first bonding structure 307 may be achieved and a process may be simplified.

Figure 3E:
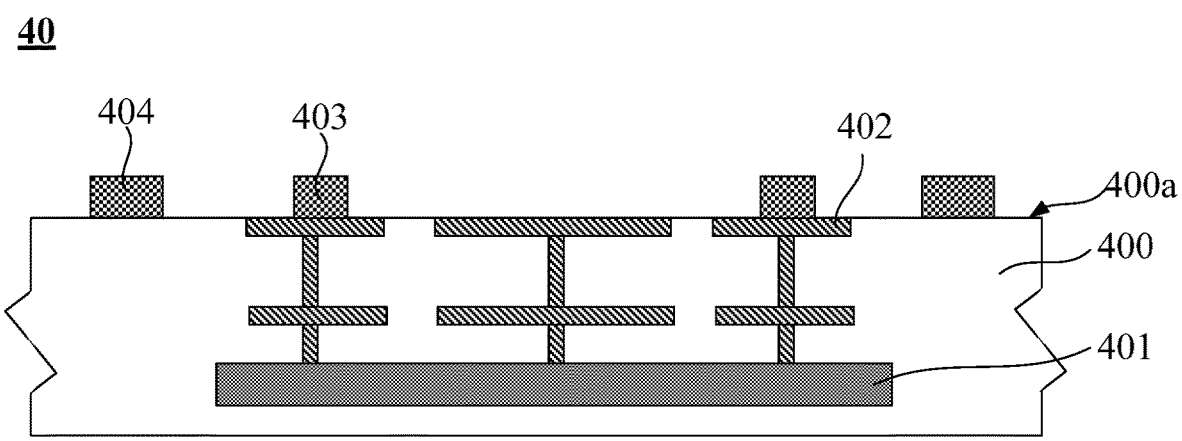

As illustrated in FIG. 3E, in S2, a substrate wafer 40 may be provided. The substrate wafer 40 may be a device wafer for forming device including CMOS device, and may include a second substrate 400 and a second device formed on the second substrate 400. The second device may include a CMOS device 401 and a metal interconnection structure 402 electrically connected to the CMOS device 401. In some embodiments where the first device 303 may be a portion of the independent device, the second device may further include another portion of the independent device electrically connected to the metal interconnection structure 402. After bonding the substrate wafer 40 with the cap wafer 30, the second device may be electrically connected to the first device 303, to form a completely independent device. For example, the independent device may be a MEMS device, and the first device 303 may be a partial structure in the MEMS device requiring a high-temperature process or other special processes. The partial structure in the MEMS device requiring a high-temperature process or other special processes and the CMOS device cannot be integrated in a same platform. The second device may include another partial structure of the MEMS device that can be integrated in a same platform with the CMOS device. A shortage that a portion of the MEMS device structure needs a high temperature or another special process which is not compatible with the CMOS fabrication process may be avoided. A second bonding structure 403 corresponding to the first bonding structure 307 and a second seal ring 404 corresponding to the first seal ring 308 may be formed on a surface of the substrate wafer 40 which is used to bond with the cap wafer 30.

The second substrate 400 may be made of any suitable substrate material, and the second device may be formed on a first surface 400a of the second substrate 400 (including a portion of the second substrate 400 under the first surface 400a) by any suitable semiconductor processes. The CMOS device 401 of the second device may be a single MOS transistor, or may include a plurality of NMOS transistors, a plurality of PMOS transistors, or a combination of NMOS transistors and PMOS transistors. The second device may include an active device including memories, logic circuits, power devices, bipolar devices, MEMS, or a combination thereof. The second device may also include optoelectrical devices including light-emitting diodes. The second device may also include passive devices including resistors, capacitors, or a combination thereof. The metal interconnection structure 402 may be used to wire out corresponding components in the second device of the substrate wafer 40, to support the operation of the first device 303 in the cap wafer. The second device may provide functions including analog to digital conversion, amplification, storage, and filtering, and may be electrically connected to the first device 303 to form a completely independent device. The second seal ring 404 may have a closed-loop structure. The second seal ring 404 and the first seal ring 308 together may seal the subsequently formed cavity to separate the cavity from the environment. The second bonding structure 403 may have a conductive pillar structure such as a metal conductive pillar structure, and may be made of a metal conductive material including Al, Ge, Cu, Au, Ni, Sn, Pt, Ag, W, or a combination thereof. When bonding the first bonding structure 307 with the second bonding structure 403, an electrical connection may be formed to electrically connect the first device 303 to the second device. The first seal ring 308 may be bonded with the second seal ring 404 to seal the cavity. The second seal ring 404 may be made of an insulating material used widely for bonding and sealing in the industry, such as a die attach film (DAF), a dry film, or a metal material. In various embodiments, the second bonding structure 403 and the second seal ring 404 may be formed simultaneously or at different time. The process for forming the second bonding structure 403 and the second seal ring 404 may be referred to the above process for forming the first bonding structure 307 and the first seal ring 308.

Figure 3F:
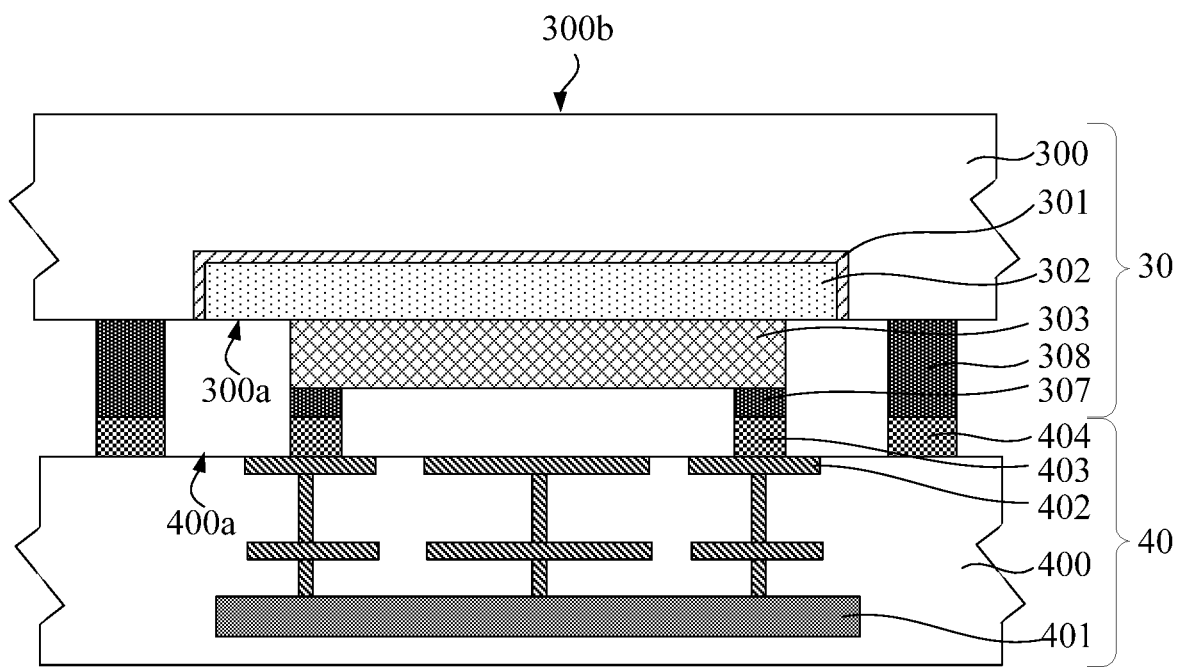

As illustrated in FIG. 3F, in S3, the cap wafer 30 may be inversed such that the second surface 300b of the cap wafer 30 faces upwards, and the first surface 300a of the cap wafer 30 may be aligned with a corresponding region of the first surface 400a of the substrate wafer 40. Then the first surface 300a of the cap wafer 30 may be bonded with a corresponding region of the first surface 400a of the substrate wafer 40 by a bonding process. Correspondingly, the first bonding structure 307 and the second bonding structure 403 may be aligned and bonded with each other, to form the electrical connection, so that the second device and the first device 303 may be electrically connected to each other. The second device may support the operation of the first device 303, or the second device may be electrically connected to the first device 303 to form the complete independent device. The first seal ring 308 and the second seal ring 407 both have a closed-loop structure (that is, a closed ring structure). The first seal ring 308 and the second seal ring 404 may be aligned and bonded with each other to form a physical connection. The first device 303 may be surrounded in a space formed by the first seal ring 308 and the second seal ring 404. The first surface 300*a* of the cap wafer 30 may be bonded with a corresponding region of the first surface 400*a* of the substrate wafer 40 by any suitable bonding process including a fusion bonding, an eutectic bonding, and an electrostatic bonding. In one embodiment, the first device 300 may protrude a lot from the surface of the first substrate 300 around the periphery of the groove 300', the first seal ring 308 and the second seal ring 404 may be used to prevent excess bonding materials from entering the cavity (the space where the first device 303 is located and surrounded by the first seal ring 308 and the second seal ring 404) when bonding the cap wafer 30 with the substrate wafer 40, besides to seal the cavity needed by the first device 303. Influence on the shape and size of the cavity may be avoided to guarantee the space where the first device 303 can move.

Figure 3G:
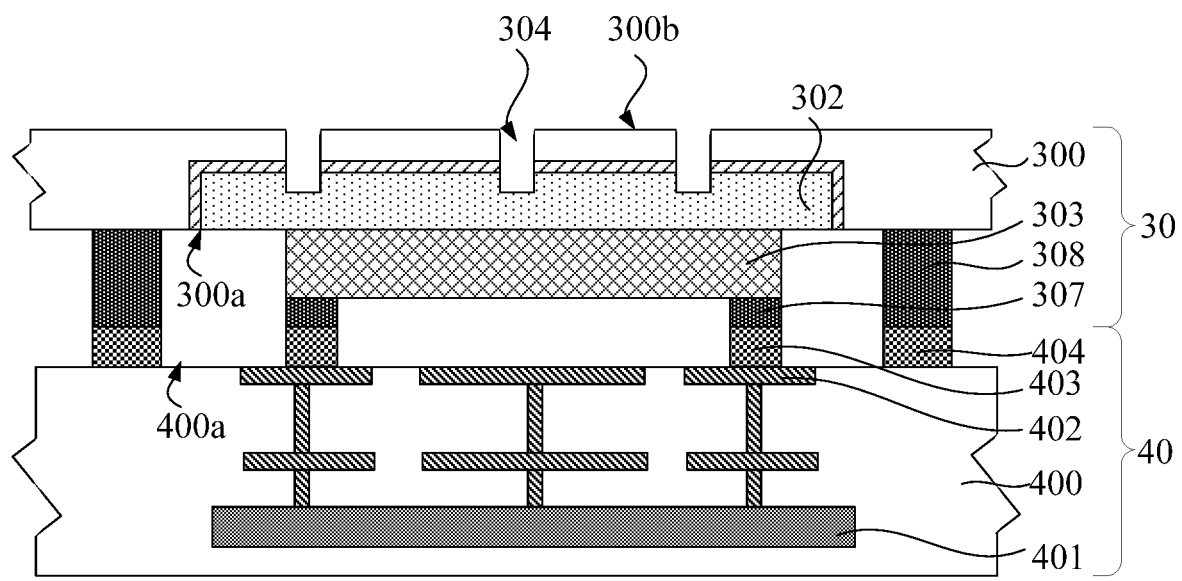

As illustrated in FIG. 3G, in S4, a large thickness of the first substrate 300 in the cap wafer 30 may be not good for forming a release hole, correspondingly the second surface 300*b* of the cap wafer 30 may be thinned first, to reduce difficulty of an etching process for forming the release hole. A ratio between depth and width of the release hole may be reduced too, to reduce the difficulty of the filling process. Subsequently, the second surface 300*b* of the cap wafer 30 may be etched by a lithography/etching process, until the surface of the sacrificial layer 302 is exposed, to form at least one release hole 304. A bottom of the at least one release hole 304 may expose the surface of the sacrificial layer 302.

In some embodiments, the process for forming the at least one release hole 304 (S4) may be performed before bonding the first surface 300*a* of the cap wafer 30 and of the first surface 400*a* of the substrate wafer 40.

Figure 3H:
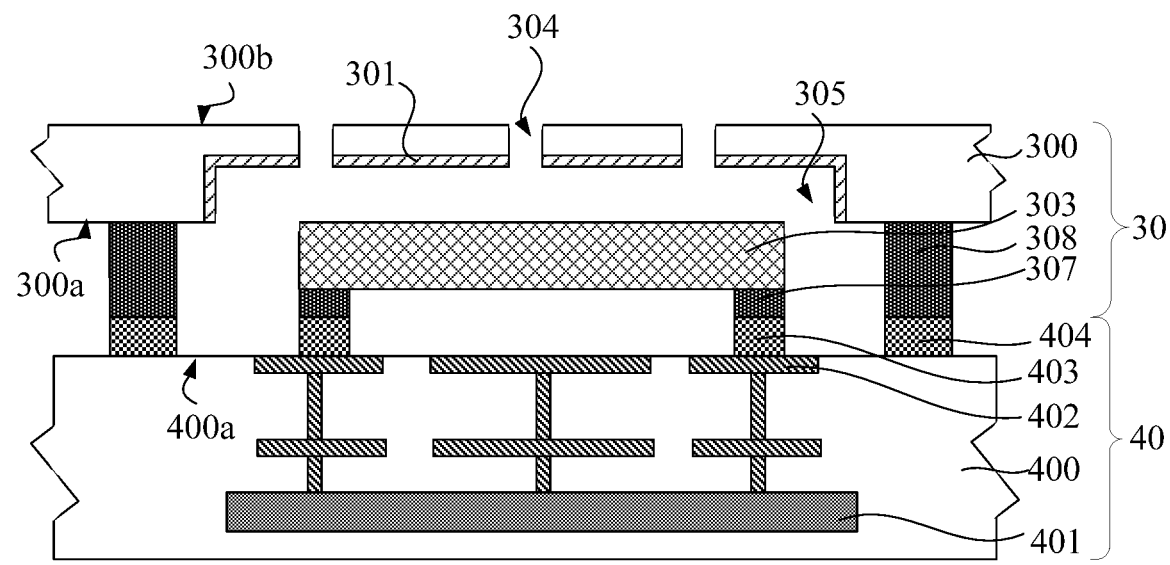

As illustrated in FIGS. 3G-3H, in S4, the sacrificial layer 302 may be removed through each of the at least one release hole 304, by a dry etching method, a wet etching method, or a combination thereof. For facilitating the removal of the sacrificial layer, when forming the sacrificial layer 302 in S1, an etching selective ratio between different materials may be considered. In S1, when filling the groove 300' with the sacrificial layer 302 after forming the groove 300' by etching the first substrate 300, the sacrificial layer 302 may be made of a material that can be removed by an ashing process including polyimide (PI), amorphous carbon, photoresist. Correspondingly, the protective layer 301 may be not needed, and serious damage on the first device 303 and the first substrate 300 may be avoided. In some other embodiments, when filling the groove 300' with the sacrificial layer 302 after forming the groove 300' by etching the first substrate 300, the sacrificial layer 302 may be made of germanium or an oxidization layer. Correspondingly, the protective layer 301 may be formed on the sidewall and the bottom wall of the groove 300'. In some other embodiments, a portion of the material of the first substrate 300 in the specific region may be transformed to the sacrificial layer 302 by the ion implantation process, and the sacrificial layer 302 may be made of a porous semiconductor material including porous silicon.

After completely removing the sacrificial layer 302, a cavity 305 may be formed between the cap wafer 30 and the substrate wafer 40, to accommodate the first device 303. The at least one release hole 304 may be connected to the cavity 305. The protective layer 301 may be preserved or may be removed through the at least one release hole 304. In one embodiment, the cavity 305 may be formed by the space surrounded by the first seal ring 308 and the second seal ring 404, and the groove 300'.

Figure 3I:
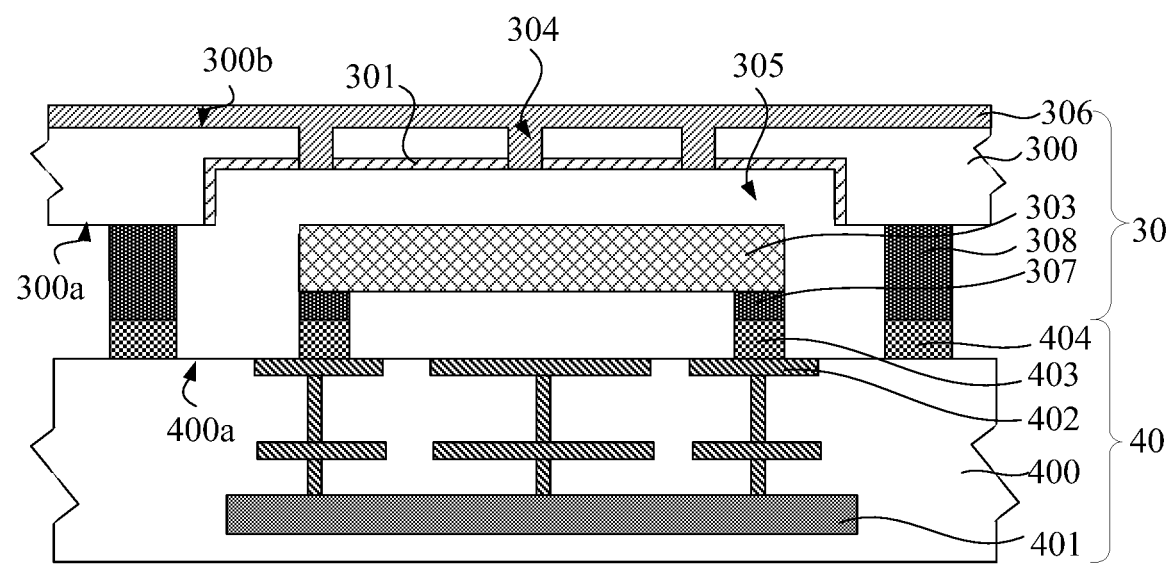

As illustrated in FIGS. 3H-3I, in S4, a film material including TEOS which can seal holes quickly may be deposited on the second surface 300*b* of the cap wafer 30 by a chemical vapor deposition process, to form a hole seal layer 306. The hole seal layer 306 may fill up the at least one release hole 304 and cover the second surface 300*b* of the cap wafer 30, to seal the at least one release hole 304 and seal the cavity 305. The cavity 305 may become a vacuum cavity correspondingly. In some other embodiments, a layer of tape may be used as the hole seal layer 306 and may stick to the second surface 300*b* of the cap wafer 30 to seal the at least one release hole 304, in a vacuum environment.

In some other embodiments, the first device 303 may need an opening cavity. For example, the first device 303 may be a portion of a microphone or a whole microphone. Correspondingly, the step for forming the hole seal layer 306 to seal the at least one release hole 304 may be unnecessary and the at least one release hole 304 may be used as sound holes of the microphone.

Subsequently, according to actual needs, the cap wafer 30 and the substrate wafer 40 may be cut from the second surface 300*b* of the cap wafer 30 or the second surface of the substrate wafer 40 (that is a surface at a side of the substrate wafer 40 away from the cap wafer 30 after bonding the cap wafer 30 with the substrate wafer 40), to form cutting trajectories and corresponding wafers.

Further, an injecting mold material may be formed by an injecting mold process to cover the second surface 300*b* of the cap wafer. The injecting mold material may include a thermosetting resin. The thermosetting resin may soften or flow during the molding process. The thermosetting resin may have plasticity, and may be formed into a certain shape and undergo a chemical reaction to crosslink and cure. The thermosetting resin may include phenol resin, urea resin, melamine-formaldehyde resin, epoxy resin, unsaturated resin, polyurethane, a polyimide, or a combination thereof. The injecting mold material may bury the cap wafer 30 and the substrate wafer 40 to form a flat upper surface which may be used as a process surface for subsequent plug process.

In the present disclosure, the groove may be formed in the cap wafer and the sacrificial layer may be formed in the groove. The first device (that is a portion of the independent device or the entire independent device) may be formed on the sacrificial layer. Subsequently, a surface of the cap wafer where the first device is located may be inversed and bonded with a surface of the substrate wafer where the second device (including another portion of the independent device or circuits supporting the operation of the independent device) is located, to seal the first device in the cap wafer and electrically connect the first device with the second device. Subsequently, the sacrificial layer may be removed to form the cavity needed by the operation of the first device in the cap wafer. The present disclosure may use two wafers including the cap wafer and the substrate wafer to achieve a packaging structure which needs three wafers including a cap wafer, a wafer to be integrated, and a substrate wafer. The wafer utilization may be improved and the cost may be reduced. The production of ultra-thin products may be facilitated. Devices may be formed on the cap wafer and the substrate wafer respectively, and the product integration level may be improved. Further, a complex device (the independent device) may be divided into two parts, and the two parts of the complex device may be formed on the cap wafer and the substrate wafer respectively. A fabrication difficulty for the complex device may be reduced significantly. When the complex device is a MEMS device, a portion of the MEMS device needing a high temperature or another special process may be used as the first device, and another portion of the MEMS device and the CMOS circuit support the operation of the MEMS device may be used as the second device. The disadvantage that the fabrication of the first device of the MEMS device and the fabrication of the CMOS circuit cannot be integrated into the same platform may be avoided.

In some embodiments, as illustrated in FIGS. 3A-3B, the depth of the groove 300' formed in the cap wafer 30 in S1 may be large, the sacrificial layer 302 may not fill up the groove 300'. Correspondingly, a top surface of the first device 303 on the sacrificial layer 302 may be flush with or slightly higher than the first surface 300a of the first substrate 300 at the peripheral of the groove 300' (for example, the top surface of the first device 303 on the sacrificial layer 302 may be 500 nm higher than the first surface 300a), the first seal ring 308 and the second seal ring 404 may be avoided. A surface (300a) of the cap wafer 30 and a surface (400a) of the substrate wafer 40 opposite to each other may be bonded together directly by adhesives or other bonding materials. Correspondingly, the cavity for the first device 303 may be formed by the groove 300' mainly.

The present disclosure also provides a packaging structure with a reduced cost and simplified process. As illustrated in FIGS. 3H-3I, the packaging structure may include a cap wafer 30 and a substrate wafer 40 bonded together. The cap wafer 30 may include a first surface 300a and a second surface 300b opposite to each other. A groove (300' in FIG. 3A) may be formed in the first surface 300a of the cap wafer 30, and a sacrificial layer 302 may be formed in the groove and can be removed subsequently. A first device 303 may be formed on the sacrificial layer 302. A second device including a CMOS device 401 and a metal interconnection structure 402 electrically connected to the CMOS device 401 may be formed on the substrate wafer 40. Then the first surface 300a of the cap wafer 30 may be bonded with a corresponding region of the first surface 400a of the substrate wafer 40 by a bonding process. After removing the sacrificial layer 302, a cavity 305 may be formed between the cap wafer 30 and the substrate wafer 40. The first device 303 may be located in the cavity 305 and may be electrically connected to the second device.

The cap wafer 30 may be made of any suitable substrate material including semiconductor, glass, quartz, transparent polymer, sapphire, or ceramic, or a combination thereof. A vertical cross-section of the groove 300' (a cross-section parallel to the first surface 300a of the cap wafer 30) may be a quadrangle, a hexagon, a circle, or an ellipse. A longitudinal cross-section of the groove 300' (a cross-section perpendicular to the first surface 300a of the cap wafer 30) may be a rectangle, a positive trapezoid, an inversed trapezoid, or a U shape. A depth of the groove 300' may be determined by a depth of the cavity needed for forming the first device subsequently, to meet packaging requirement for the first device. The depth of the groove 300' may be about 5 μm to 20 μm. Other devices or metal interconnection structures besides the first device may also be formed in the cap wafer 30, as long as these structures do not impede the groove and the at least one release hole 304. The devices may include active devices including memories, logic circuits, power devices, bipolar devices, independent MOS transistors, or a combination thereof. The devices may also include optoelectrical devices including light-emitting diodes. The devices may also include passive devices including resistors, capacitors, or a combination thereof.

The sacrificial layer 302 may be made of at least one of polyimide (PI), amorphous carbon (α-C), silicon oxide (OX), phosphorus-doped silica glass (PSG), and boron-doped silica glass (BPSG). The sacrificial layer 302 may also be made of at least one of semiconductor materials different from a material of the cap wafer 30. For example, the first substrate 300 may be made of single crystalline silicon, and semiconductor materials different from a material of the first substrate 300 may include germanium, amorphous silicon, polycrystalline silicon. In one embodiment, a protective layer 301 may be formed between the sacrificial layer 302 and a bottom wall and sidewalls of the groove 300' by a thermal oxidization process or a chemical vapor deposition process (such as a plasma-enhanced chemical vapor deposition process, PECVD). The protective layer 301 may protect the first substrate from damage when releasing the sacrificial layer 302. The protective layer 301 may be made of a material including silicon oxide, silicon nitride, silicon oxynitride, anti-reflective film, and adsorbent. The protective layer 301 may also be made of a metal material including Mo and Al, or a metal nitride material including TiN and MoAlN.

The first device 303 may be formed on the sacrificial layer 302 and may not cover other regions outside the sacrificial layer 302. Correspondingly, after removing the sacrificial layer 302, the first device 303 may be completely separated from the cap wafer. A thickness of the sacrificial layer 302 may only be needed to meet the packaging requirements. In one embodiment, the sacrificial layer 302 may fill up the groove and a surface of the sacrificial layer 302 contacting with the first device 303 may be flush with the first surface 300a of the cap wafer 30. In some other embodiments, a surface of the sacrificial layer 302 filled in the groove and in contact with the first device 303 may be lower than the first surface 300a of the cap wafer 30. In some other embodiments, a surface of the sacrificial layer 302 filled in the groove and in contact with the first device 303 may be higher than the first surface 300a of the cap wafer 30. The first device 303 may be a portion of an independent device or an entire independent device with an independent function. The second device in the substrate wafer 40 may include a CMOS circuit to support the operation of the first device 303. The disadvantage that the fabrication of the first device of the MEMS device and the fabrication of the CMOS circuit are not compatible and cannot be integrated into the same platform may be avoided. The independent device corresponding to the first device 303 may include active devices including memories, logic circuits, power devices, bipolar devices, MEMS devices, or a combination thereof. The independent device may also include optoelectrical devices including light-emitting diodes. The independent device may also include passive devices including resistors, capacitors, or a combination thereof. The MEMS devices may include at least one of a gyroscope, an accelerometer, an inertial sensor, a pressure sensor, a flow sensor, a displacement sensor, an electric field sensor, an electric field strength sensor, a current sensor, a magnetic flux sensor, a magnetic field strength sensor, a temperature sensor, a heat flow sensor, a thermal conductivity sensor, a light modulator, an acoustic sensor, a gas sensor, a humidity sensor, an ion sensor, a biosensor. The independent device corresponding to the first device 302 may be a chip including only one component, or a chip including a plurality of components with a same structure, or a chip with a plurality of components with different structures and/or different function.

In one embodiment, the at least one release hole 304 may be formed on the second surface 300b of the cap wafer 30 to expose the sacrificial layer 302. The at least one release hole 304 may be connected to the cavity 305 after removing the sacrificial layer 302. In some embodiment, the packaging structure may further include a hole sealing layer 306. The hole sealing layer 306 may be a material layer at least filling up the at least one release hole 304 (the material layer may fill up the at least one release hole 304 and cover the whole second surface 300b of the cap wafer 30 with a certain thickness) or a tape adhered to the second surface 300b of the cap wafer 30.

The substrate wafer 40 may be a device wafer with completed CMOS devices, and may include a second substrate 400 and a second device on the second substrate 400. In one embodiment, the first device 303 may include the whole independent device. Correspondingly, the second device may include a CMOS circuit structure for supporting the operation of the independent device. The CMOS circuit structure may include a CMOS device 401 and a metal interconnection structure 402 electrically connected to the CMOS device 401. In some other embodiments, the first device 303 may include a portion of the independent device. Correspondingly, the second device may include another portion of the independent device and a CMOS circuit structure for supporting the operation of the independent device. The first device 303 and a portion of the independent device in the second device may be electrically connected, to form a completely independent device. For example, the independent device may be a MEMS device, and the first device 303 may be a partial structure in the MEMS device requiring a high-temperature process or other special processes. The partial structure in the MEMS device requiring a high-temperature process or other special processes and the CMOS device cannot be integrated in a same platform. The second device may include another partial structure of the MEMS device that can be integrated in a same platform with the CMOS device. A second bonding structure 403 corresponding to the first bonding structure 307 and a second seal ring 404 corresponding to the first seal ring 308 may be formed on a surface of the substrate wafer 40 which is used to bond with the cap wafer 30. The disadvantage that the fabrication of the first device of the MEMS device and the fabrication of the CMOS circuit are not compatible and cannot be integrated into the same platform may be avoided.

In some embodiments, the packaging structure may further include a first bonding structure 307, a first seal ring 308, a second bonding structure 403, and a second seal ring 404. The first bonding structure 307 may be disposed on the first device 303, and the first seal ring 308 may be disposed on the first surface 300a of the cap wafer 30 at the peripheral of the groove where the sacrificial layer 302 is located. The second bonding structure 308 may be disposed on the second device, and may be aligned and bonded with the first bonding structure 307, to form the electrical connection between the first device 303 and the second device. The second seal ring 403 may be formed on the first surface 400a of the substrate wafer 40 at the peripheral of the second device. The second seal ring 403 may be aligned and bonded with the first seal ring 308, to form a physical connection between the cap wafer 30 and the substrate wafer 40. The first seal ring 308 and the second seal ring 404 may have a closed-loop structure, to seal the cavity 305.

The packaging structure provided by the present disclosure may have a semi-finished structure, and may include the cap wafer, the substrate wafer, and the sacrificial layer that can be removed. The cap wafer may be used as the cap layer for vacuum packaging and also may be used to form a portion or the entire independent device including MEMS devices (the first device). The sacrificial layer that can be removed may be formed in the groove of the cap wafer. After bonding the cap wafer with the substrate wafer, the sacrificial layer may be removed, and the first device on the cap wafer may be sealed in the cavity correspondingly. The wafer utilization may be improved and the cost may be reduced. The production of ultra-thin products may be facilitated. Devices may be formed on the cap wafer and the substrate wafer respectively, and the product integration level may be improved. Further, a complex device (the independent device) may be divided into two parts, and the two parts of the complex device may be formed on the cap wafer and the substrate wafer respectively. A fabrication difficulty for the complex device may be reduced significantly. When the complex device is a MEMS device, a portion of the MEMS device needing a high temperature or another special process may be used as the first device, and another portion of the MEMS device and the CMOS circuit support the operation of the MEMS device may be used as the second device. The disadvantage that the fabrication of the first device of the MEMS device and the fabrication of the CMOS circuit cannot be integrated into the same platform may be avoided.

In some embodiments, most of the first device 303 or the entire first device 303 may be surrounded by the groove, and the depth of the groove may be large enough to meet a space requirement of the operation of the first device 303. Correspondingly, the cavity 305 for the first device 303 may be formed by the groove 300' mainly. The first seal ring 308 and the second seal ring 404 may be avoided. A surface of the cap wafer 30 and a surface of the substrate wafer 40 opposite to each other may be bonded together directly by adhesives or other bonding materials.

In the present disclosure, the groove may be formed in the cap wafer and the sacrificial layer may be formed in the groove. The first device (that is a portion of the independent device or the entire independent device) may be formed on the sacrificial layer. Subsequently, a surface of the cap wafer where the first device is located may be inversed and bonded with a surface of the substrate wafer where the second device (including another portion of the independent device or circuits supporting the operation of the independent device) is located, to seal the first device in the cap wafer and electrically connect the first device with the second device. Subsequently, the sacrificial layer may be removed to form the cavity needed by the operation of the first device in the cap wafer. The present disclosure may use two wafers including the cap wafer and the substrate wafer to achieve a packaging structure that needs three wafers including a cap wafer, a wafer to be integrated, and a substrate wafer. The wafer utilization may be improved and the cost may be reduced. The production of ultra-thin products may be facilitated. Devices may be formed on the cap wafer and the substrate wafer respectively, and the product integration level may be improved. Further, a complex device (the independent device) may be divided into two parts, and the two parts of the complex device may be formed on the cap wafer and the substrate wafer respectively. A fabrication difficulty for the complex device may be reduced significantly. When the complex device is a MEMS device, a portion of the MEMS device needing a high temperature or another special process may be used as the first device, and another portion of the MEMS device and the CMOS circuit support the operation of the MEMS device may be used as the second device. The disadvantage that the fabrication of first device of the MEMS device and the fabrication of the CMOS circuit cannot be integrated into the same platform may be avoided.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A packaging method, comprising:
providing a cap wafer with a groove in the cap wafer, forming a sacrificial layer in the groove, and forming a first device on the sacrificial layer;
providing a substrate wafer, and forming a second device on the substrate wafer;
bonding a surface of the cap wafer having the first device formed thereon with a surface of the substrate wafer having the second device formed thereon, wherein the first device and the second device are electrically connected; and
removing the sacrificial layer from a side of the cap wafer away from the substrate wafer, wherein a cavity is formed between the cap wafer and the substrate wafer, and the first device is located in the cavity and is fully spaced apart from the cap wafer by the cavity.

2. The method according to claim 1, further including:
before forming the sacrificial layer in the groove, forming a protective layer on sidewalls and a bottom wall of the groove.

3. The method according to claim 1, wherein:
before bonding the cap wafer with the substrate wafer, the method further includes forming a first bonding structure on the first device and forming a second bonding structure on the second device corresponding to the first bonding structure; and
when bonding the cap wafer with the substrate wafer, the first bonding structure and the second bonding structure are aligned and bonded together to form an electrical connection there-between.

4. The method according to claim 3, wherein each of the first bonding structure and the second bonding structure is made of a material including at least one of Al, Ge, Cu, Au, Ni, Sn, Ag.

5. The method according to claim 1, further including:
before bonding the surface of the cap wafer with the surface of the substrate wafer, forming a first seal ring on the surface of the cap wafer having the first device formed thereon, and forming a second seal ring on the surface of the substrate wafer having the second device formed thereon, wherein the first seal ring is located on the surface of the cap wafer at a peripheral of the groove and the second seal ring is corresponding to the first seal ring and located on the surface of the substrate wafer at a peripheral of the second device; and
when bonding the cap wafer with the substrate wafer, aligning and bonding the first seal ring to the second seal ring, thereby sealing the cavity.

6. The method according to claim 5, wherein each of the first seal ring and the second seal ring is made of an insulating dielectric or a metal.

7. The method according to claim 1, further including:
before or after bonding the cap wafer with the substrate wafer, etching the cap wafer from the side of the cap wafer away from the substrate wafer to form at least one release hole exposing the sacrificial layer;
when removing the sacrificial layer, removing the sacrificial layer from the side of the cap wafer away from the substrate wafer through the at least one release hole; and
after removing the sacrificial layer, sealing the at least one release hole from the side of the cap wafer away from the substrate wafer, to seal the first device in the cavity.

8. The method according to claim 7, before etching the cap wafer to form the at least one release hole, further including thinning the cap wafer from the side of the cap wafer away from the substrate wafer.

9. The method according to claim 1, wherein:
the first device includes a whole independent device, and the second device includes a circuit structure for supporting an operation of the independent device; or
the first device includes a portion of an independent device, and the second device includes another portion of the independent device, wherein the first device is electrically connected to the second device to form the whole independent device.

10. The method according to claim 9, wherein the independent device is a microelectromechanical system (MEMS) device.

11. A packaging structure, comprising:
a cap wafer including a groove, a sacrificial layer disposed in the groove, and a first device disposed on the sacrificial layer, wherein the sacrificial layer is removed subsequently; and
a substrate wafer, and a second device disposed on the substrate wafer;
wherein:
a surface of the cap wafer having the first device disposed thereon is bonded with a surface of the substrate wafer having the second device disposed thereon, to form an electrical connection between the first device and the second device; and
after removing the sacrificial layer, a cavity is formed between the cap wafer and the substrate wafer, wherein the first device is located in the cavity and is fully spaced apart from the cap wafer by the cavity.

12. The packaging structure according to claim 11, further including:
a protective layer between the sacrificial layer and an inner surface of the groove.

13. The packaging structure according to claim 11, further including: a first bonding structure on the first device and a second bonding structure on the second device corresponding to the first bonding structure, wherein:
the first bonding structure is aligned and bonded with the second bonding structure to form an electrical connection between the first device and the second device.

14. The packaging structure according to claim 13, wherein each of the first bonding structure and the second bonding structure is made of a material including at least one of Al, Ge, Cu, Au, Ni, Sn, Ag.

15. The packaging structure according to claim 11, further including at least one release hole at a side of the cap wafer away from the substrate wafer, wherein:
the at least one release hole exposes the sacrificial layer; and
after removing the sacrificial layer, the at least one release hole is connected to the cavity.

16. The packaging structure according to claim 15, further including a hole-seal layer, wherein the hole-seal layer is a material layer at least filling up the at least one release hole or a tape affixed to the side of the cap wafer away from the substrate wafer.

17. The packaging structure according to claim 11, wherein:
the first device includes a whole independent device, and the second device includes a circuit structure for supporting an operation of the independent device; or
the first device includes a portion of an independent device, and the second device includes another portion of the independent device, wherein the first device is electrically connected to the second device to form the whole independent device.

18. The packaging structure according to claim 17, wherein the independent device is a MEMS device.

19. A packaging structure, comprising:
a cap wafer including a groove, a sacrificial layer disposed in the groove, and a first device disposed on the sacrificial layer, wherein the sacrificial layer is removed subsequently;
a substrate wafer, and a second device disposed on the substrate wafer, wherein:
a surface of the cap wafer having the first device disposed thereon is bonded with a surface of the substrate wafer having the second device disposed thereon, to form an electrical connection between the first device and the second device; and after removing the sacrificial layer, a cavity is formed between the cap wafer and the substrate wafer, wherein the first device is located in the cavity; and
a first seal ring and a second seal ring, wherein:
the first seal ring is formed on the surface of the cap wafer having the first device disposed thereon, and located on the surface of the cap wafer at a peripheral of the groove;
the second seal ring is formed on the surface of the substrate wafer having the second device disposed thereon, and located on the surface of the substrate wafer at a peripheral of the second device; and
the first seal ring is aligned and bonded with the second seal ring, to seal the cavity.

20. The packaging structure according to claim 19, wherein each of the first seal ring and the second seal ring is made of an insulating dielectric or a metal.

\* \* \* \* \*